(12) United States Patent
Kinkaid et al.

(10) Patent No.: US 11,746,602 B2
(45) Date of Patent: Sep. 5, 2023

(54) SYSTEMS AND METHODS FOR TESTING ELECTRICAL PROPERTIES OF A DOWNHOLE POWER CABLE

(71) Applicant: POWER FEED-THRU SYSTEMS AND CONNECTORS LLC, Deer Park, TX (US)

(72) Inventors: Roy Kinkaid, Humble, TX (US); Brandon Marbach, Spring, TX (US); James Patrick Payne, League City, TX (US); Brad Yingst, Friendswood, TX (US); Leroy Cantu, Manvel, TX (US); Michael Colescott, Galveston, TX (US)

(73) Assignee: POWER FEED-THRU SYSTEMS AND CONNECTORS LLC, Deer Park, TX (US)

( * ) Notice: Subject to any disclaimer, the term of this patent is extended or adjusted under 35 U.S.C. 154(b) by 0 days.

(21) Appl. No.: 16/832,472

(22) Filed: Mar. 27, 2020

(65) Prior Publication Data
US 2021/0270091 A1 Sep. 2, 2021

Related U.S. Application Data

(60) Provisional application No. 62/982,667, filed on Feb. 27, 2020.

(51) Int. Cl.
*G01R 31/52* (2020.01)
*E21B 17/02* (2006.01)
(Continued)

(52) U.S. Cl.
CPC ............ *E21B 17/028* (2013.01); *E21B 43/01* (2013.01); *G01R 31/52* (2020.01); *E21B 43/128* (2013.01); *H02K 5/132* (2013.01); *H02K 5/225* (2013.01)

(58) Field of Classification Search
CPC ...... E21B 17/028; E21B 43/01; E21B 43/128; E21B 33/0385; H01B 7/00; H02G 9/06;
(Continued)

(56) References Cited

U.S. PATENT DOCUMENTS

| 3,714,455 A | * | 1/1973 | Chepelev | G01R 31/58 |
| | | | | 307/112 |
| 3,879,659 A | * | 4/1975 | Lawson, Jr. | G01R 31/58 |
| | | | | 324/501 |

(Continued)

FOREIGN PATENT DOCUMENTS

| GB | 2491823 A | * | 12/2012 | ........... E21B 43/128 |
| RU | 178299 U1 | * | 3/2018 | |

(Continued)

OTHER PUBLICATIONS

WIPO, International Search Report & Written Opinion received in corresponding International application No. PCT/US2020/025273, dated Jun. 26, 2020 (6-sheets).

*Primary Examiner* — Patrick Assouad
*Assistant Examiner* — Demetrius R Pretlow
(74) *Attorney, Agent, or Firm* — Alexander B. Uber; Gray Reed

(57) ABSTRACT

Systems and methods for testing downhole power cables wherein such systems and methods utilize a mounting bracket having a PEEK insulator extending from a first face of said bracket and at least one flexible lead extending from a second face of said bracket. Such systems and methods may accommodate three such flexible leads that are configured to interface with power cables. A shunting block may be incorporated in a protective cap configured to fit over the PEEK insulator extension from said first face of said bracket.

15 Claims, 5 Drawing Sheets

(51) Int. Cl.
*E21B 43/01* (2006.01)
*E21B 43/12* (2006.01)
*H02K 5/132* (2006.01)
*H02K 5/22* (2006.01)

(58) Field of Classification Search
CPC ........ G01R 31/52; G01R 31/50; G01R 31/54; G01R 31/55; G01R 31/58; H02K 5/132; H02K 5/225
See application file for complete search history.

(56) References Cited

U.S. PATENT DOCUMENTS

| | | | |
|---|---|---|---|
| 4,158,167 A * | 6/1979 | Tanno | G01R 31/58 324/522 |
| 4,585,287 A * | 4/1986 | Ramsey | H01R 13/523 439/588 |
| 6,192,983 B1 | 2/2001 | Neuroth et al. | |
| 2006/0102341 A1 | 5/2006 | Freer et al. | |
| 2006/0213659 A1 * | 9/2006 | McCoy | E21B 43/128 166/381 |
| 2007/0287318 A1 * | 12/2007 | Jackson | H01R 4/5091 439/320 |
| 2008/0171461 A1 * | 7/2008 | Jackson | H01R 4/5025 439/589 |
| 2009/0090517 A1 * | 4/2009 | Jackson | E21B 33/12 166/385 |
| 2009/0260807 A1 * | 10/2009 | Abou El Azm | E21B 19/22 166/66 |
| 2010/0155057 A1 * | 6/2010 | Atherton | G01R 29/16 166/250.01 |
| 2013/0277067 A1 * | 10/2013 | Emerson | E21B 17/028 166/65.1 |
| 2015/0029036 A1 * | 1/2015 | Xiao | E21B 43/128 340/855.3 |
| 2016/0178682 A1 * | 6/2016 | Eldridge | H01R 13/713 324/538 |
| 2016/0245867 A1 * | 8/2016 | Diesen | B63C 11/52 |
| 2016/0296632 A1 | 10/2016 | Chipman | |
| 2017/0058653 A1 * | 3/2017 | Gupta | E21B 43/128 |
| 2017/0110220 A1 * | 4/2017 | Romer | D07B 1/147 |
| 2017/0211190 A1 * | 7/2017 | Glasscock | B08B 3/022 |
| 2017/0356949 A1 * | 12/2017 | Tomkins | G01R 15/202 |
| 2018/0067003 A1 * | 3/2018 | Michiwaki | G01L 1/22 |
| 2018/0323587 A1 * | 11/2018 | O'Grady | E21B 43/128 |
| 2020/0080388 A1 * | 3/2020 | Leismer | E21B 17/023 |
| 2021/0246771 A1 * | 8/2021 | Ejim | E21B 43/128 |

FOREIGN PATENT DOCUMENTS

| | | | | |
|---|---|---|---|---|
| WO | 1996023368 A1 | 8/1996 | | |
| WO | WO-2006102456 A1 * | 9/2006 | ........... | E21B 43/128 |
| WO | WO-2014057566 A1 * | 4/2014 | ........ | G01R 33/1238 |
| WO | WO-2015084957 A1 * | 6/2015 | ........... | E21B 49/084 |

* cited by examiner

SYSTEMS AND METHODS FOR TESTING ELECTRICAL PROPERTIES OF A DOWNHOLE POWER CABLE

CITATION TO PRIOR APPLICATIONS

The present application is a continuation of and claims priority to U.S. Nonprovisional Application No. 62/982,667, titled "Systems and Methods for Testing Electrical Properties of a Downhole Power Cable" and filed on Feb. 27, 2020.

BACKGROUND

1. Field of Inventions

The field of this application and any resulting patent includes systems and methods for testing electrical properties of a downhole power cable.

2. Description of Related Art

In the past, various methods and apparatus have been disclosed, proposed, and used for testing electrical properties of a downhole power cable including methods and apparatus disclosed in the references appearing on the face of this patent, e.g., earlier patents and publications. However, it is contemplated that those prior methods and apparatus may lack the specific combinations of steps and features described as being part of certain methods and apparatus herein. Furthermore, some of those prior methods and systems are contemplated as having various shortcomings; and at least certain embodiments of the methods and apparatus described herein may overcome some of those shortcomings and problems. Also, certain methods and apparatus described may have benefits that would be surprising and unexpected to a person of ordinary skill in the art who is familiar with the prior art existing at the time of inventions claimed herein but without the benefit of the disclosure herein.

DETAILED DESCRIPTION

1. Introduction

Figure 1:
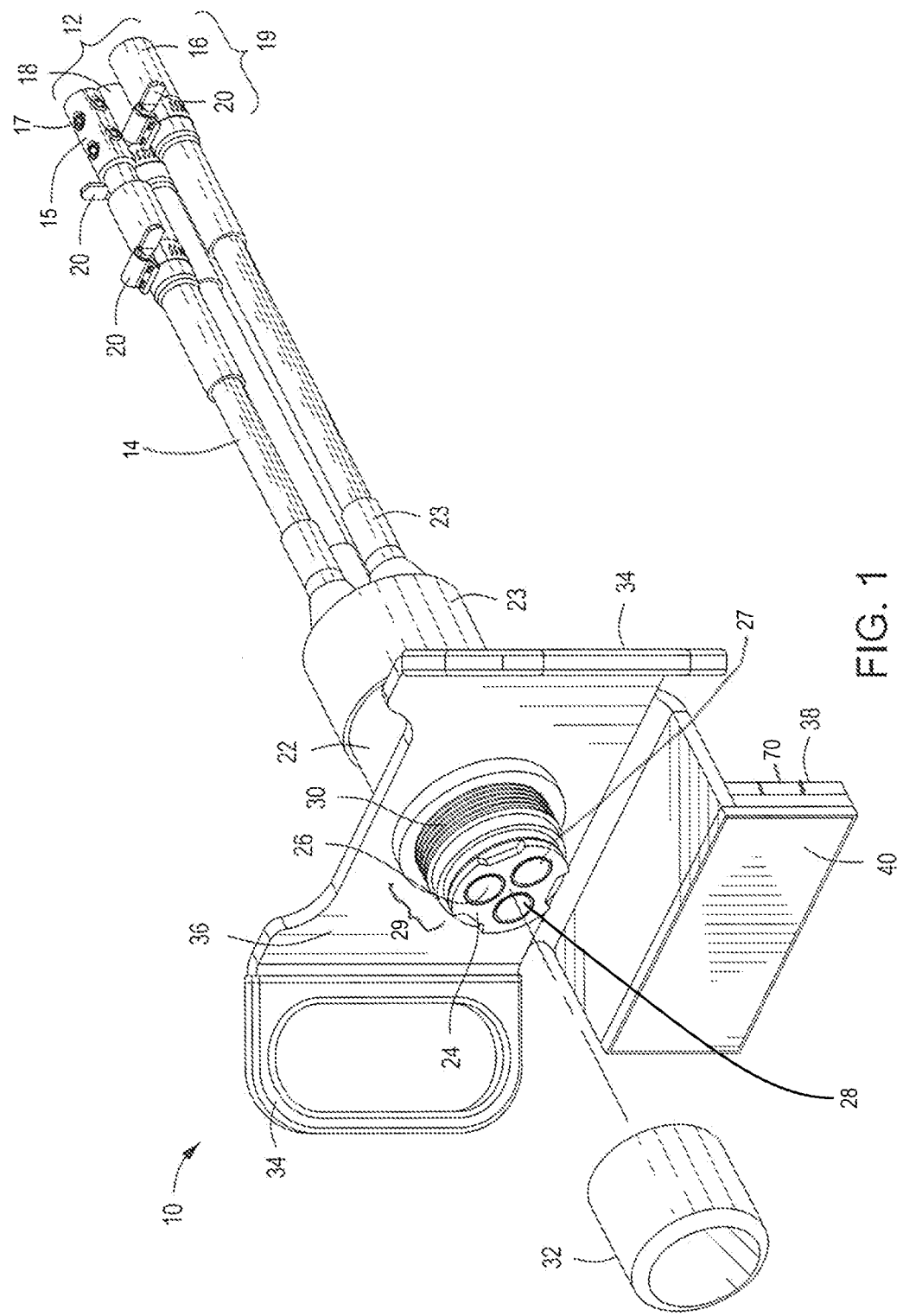
FIG. 1 is a perspective view of an embodiment of an extension device.
Figure 2A:
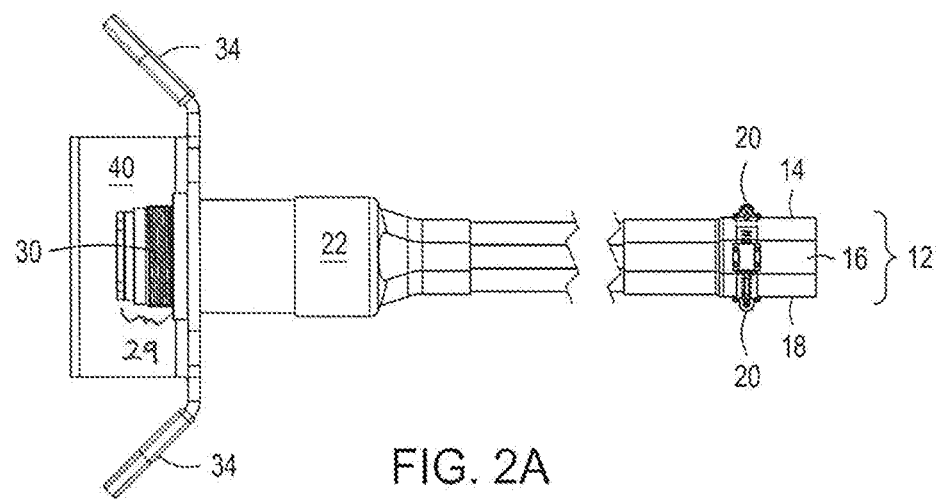
FIGS. 2A, 2B, and 2C are, respectively, a top view, a side view, and a front view of an embodiment of an extension device.
Figure 2B:
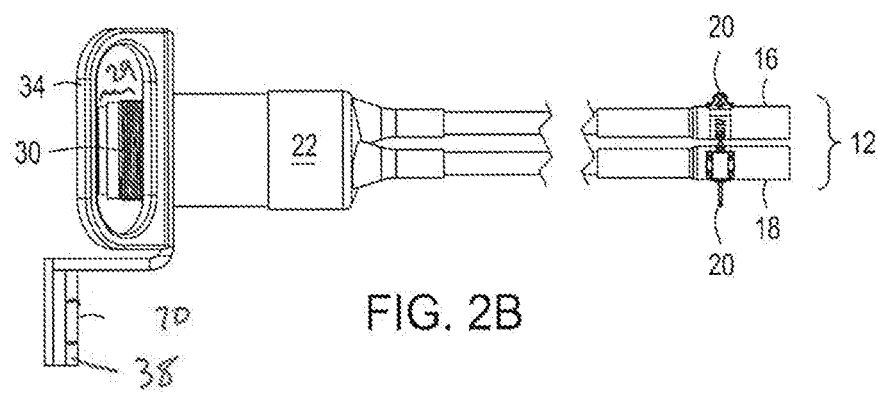
Figure 2C:
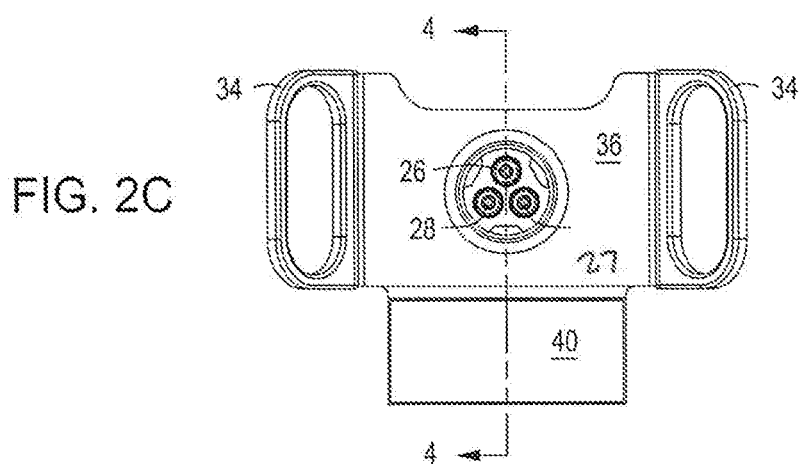

A detailed description will now be provided. The purpose of this detailed description, which includes the drawings, is to satisfy the statutory requirements of 35 U.S.C. § 112. For example, the detailed description includes a description of the inventions and sufficient information that would enable a person having ordinary skill in the art to make and use the inventions defined by the claims. In the figures, like elements are generally indicated by like reference numerals regardless of the view or figure in which the elements appear. The figures are intended to assist the description and to provide a visual representation of certain aspects of the subject matter described herein. The figures are not all necessarily drawn to scale, nor do they show all the structural details of the systems, nor do they limit the scope of the claims.

Each of the appended claims defines a separate invention which, for infringement purposes, is recognized as including equivalents of the various elements or limitations specified in the claims. Depending on the context, all references below to the "invention" may in some cases refer to certain specific embodiments only. In other cases, it will be recognized that references to the "invention" will refer to the subject matter recited in one or more, but not necessarily all, of the claims. Each of the inventions will now be described in greater detail below, including specific embodiments, versions, and examples, but the inventions are not limited to these specific embodiments, versions, or examples, which are included to enable a person having ordinary skill in the art to make and use the inventions when the information in this patent is combined with available information and technology. Various terms as used herein are defined below, and the definitions should be adopted when construing the claims that include those terms, except to the extent a different meaning is given within the specification or in express representations to the Patent and Trademark Office (PTO). To the extent a term used in a claim is not defined below or in representations to the PTO, it should be given the broadest definition persons having skill in the art have given that term as reflected in printed publications, dictionaries, or issued patents.

While the present invention may be discussed in terms of certain embodiments, such embodiments are by no means an exclusive description of the inventions. Other specific embodiments, including those referenced in the drawings or other materials accompanying this disclosure, are encompassed by this application and any patent that issues therefrom.

2. Specific Embodiments in the Figures

The drawings presented herein are for illustrative purposes only and are not intended to limit the scope of the claims. Rather, the drawings are intended to help enable one having ordinary skill in the art to make and use the claimed inventions.

Electronic submersible pumps (ESPs) are used in a number of downhole oil and gas well applications. Each ESP includes a motor, and a pump that are both electronically connected to a control system and a power cable. The power cable runs downhole between the production tubing and the well casing to provide power to the motor positioned downhole. Power cable is provided on a cable reel including a drum with cross arms at the drum openings. One end of the power cable is spliced to connect with an ESP motor, and then the motor is lowered downhole.

As the motor is being lowered, the power cable is unreeled from the cable reel. At certain points when lowering the motor, a well technician may want to test the connection integrity between the power cable and the motor. In order to perform this testing, the cable reel stops spinning and the motor stops lowering downhole. A multimeter or other measurement device is coupled to the other end of the power cable that is not spliced to the motor (free end). Generally, the free end of the power cable is positioned inside the drum portion of the cable reel, such that a well technician must reach into the cable reel drum to access the other end of the power cable. If the cable reel resumes spinning when the technician is unaware, the cross arms may cause serious injury to the technician while he is reaching into the drum of the cable reel.

The apparatuses and methods described herein offer ways for a well technician to test the connection between the power cable and the downhole motor without having to reach into the drum of the cable reel.

Referring to FIG. 1 and FIGS. 2A-2C, an extension device 10 is shown from various angles, which has features any one of which may be found in various specific embodiments, including both those that are shown in this specification and those that are not shown. The extension cables 14, 16, 18 extend into a housing 22 of the extension device 10 and permit the ability of the rig operator to reach the female electrical connections 26, 27, 28 coupled to the cable reel through the extension cables 14, 16, 18 without having to reach inside the reel (see FIG. 3).

The housing 22 may enclose a coupling that connects one end of the extension cables 14, 16, 18 to the female connections 26, 27, 28 on the connection plate 24. The housing 22 may be partially encased in heat shrink tubing 23 to ensure a water-tight connection between the junction of the extension cables 14, 16, 18 and the housing 22. The housing 22 may be positioned in an opening in the handle body 36, and the housing 22 may be secured to the handle body 36 using threads 30 on the outer surface of the housing 22 and retaining nut 15. The handle body 36 may include two handles 34 that an operator may use to move and position the extension device 10 on and off a cable reel. The mount 40 of the extension device 10 may include a magnet 70 that is capable of securing the extension device 10 to a cross arm of a metal cable reel (see FIG. 3).

Extension cables 14, 16, 18 include flexible conductor leads enclosed in an insulating material (e.g., polypropylene). Because the extension cables 14, 16, 18 are separated rather than coupled to one another, it is possible to couple the extension cables 14, 16, 18 to any type of power cable configuration (e.g., flat cable or round cable). The ends of the cables 14, 16, 18 are covered in a sliding, insulating tube 19 that can slide towards the handles 34 of the device to reveal metal contacts 15 containing set screws 17. Each of the three wires of the power cable is stripped so that bare conductor is showing. The conductor is placed inside the metal contact 15, and the set screws 17 are tightened to secure the connection between the extension cable 14, 16, 18 and the conductor. After tightening the set screws 17, the insulating tube 19 is slid back over the metal contact 15 to insulate the metal contact 15 from the other two metal contacts on the ends of the other two extension cables. After the insulating tube 19 is slid away from the handles 34 and into place to cover the metal contact 15, a pipe clamp 20 is tightened to secure the insulating tube 19 in place to prevent inadvertent sliding of the insulating tube 19. The extension device 10 may be coupled to the reel before, during, or after coupling each of the three wires of the power cable to the extension cables 14, 16, 18 as seen in FIG. 3.

A cover cap 32 may be included to prevent dust and debris from entering the electrical contacts when the extension device 10 is not connected to a control panel for testing or operation. The cover cap 32 may include a screw-type connection, wherein the cover cap 32 includes threads (not shown) on the cover cap inner surface and the cylindrical surface of the protruding extension face 29 also includes threads 30. The cover cap 32 may include a spring lock type connection, where a user pushes the cover cap 32 into the body of the extension device 10 against the force of a spring, rotates the cover cap 32 around its axis (e.g., between 5 and 90 degrees), and removes the cover cap 32; in this instance, the cover cap 32 may include a channel which corresponds to a protrusion (not shown) on the cylindrical surface of the protruding extension face 29. In other embodiments, as depicted in the accompanying materials, cover cap 32 may be configured to act as a shunting block.

Figure 3:
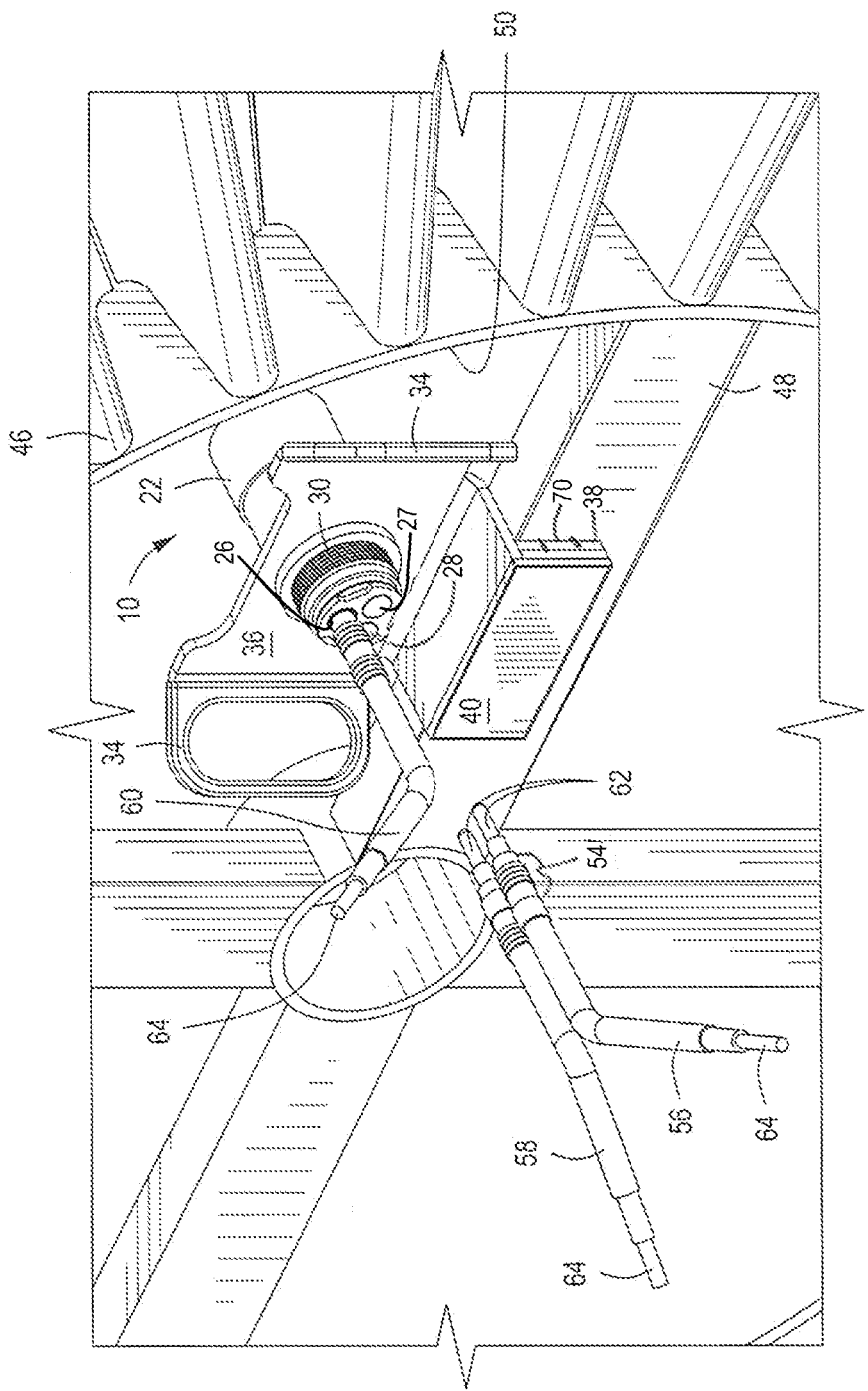
FIG. 3 is a perspective view of an embodiment of an extension device coupled to a cable reel.

Referring to FIG. 3, an extension device 10 coupled to a wire reel 46 is shown, which has features any one of which may be found in various specific embodiments, including both those that are shown in this specification and those that are not shown. The extension cables are coupled to the wires of the power cable that protrude from the drum inner surface 50 of the cable reel 46 (see FIGS. 5A and 5B). The extension device 10 is coupled to a cross arm 48 of the cable reel 46 using magnet 70 on the inner surface 38 of mount 40 of the extension device 10. The magnet 70 is strong enough such that the extension device 10 stays in place on the cable arm 48 when the cable reel 46 has rotated 180 degrees and the extension device 10 is upside down. Secondary cables 56, 58, 60 may be capable of coupling to the female connections 26, 27, 28 on the connection plate 24. The secondary cables 56, 58, 60 may include a ribbed section 54 of insulation to better secure one end of the secondary cable to the female connection. The other end of the secondary cables 56, 58, 60 may be stripped of insulation such that bare conductor 64 is accessible. The stripped end of the secondary cables 56, 58, 60 may be used to connect to a measurement device (e.g., a multimeter) used for checking the integrity of the power cable connections to the ESP motor downhole (e.g., ensure no short exists between wires) (see FIGS. 5A and 5B). Alternatively, a measurement device may be used to take readings using the female connections 26, 27, 28 directly rather than through the secondary cables 56, 58, 60. In both cases, the well technician will be able to take measurements without placing his hands inside the drum of the cable reel 46.

As the motor is lowered downhole, the power cable may be clamped against the outer surface of production tubing to support the weight of the power cable. As each additional length of production tubing is installed, the power cable may unwind from the cable reel to feed the power cable downhole. Between installation of lengths of production tubing (e.g., when connections are being made between two lengths of production tubing), the power cable does not unwind from the cable reel, and the cable reel need not rotate. During this period of non-rotation, a well technician may take readings using the three electrical contacts provided by the stripped ends 64 of the secondary cables 56, 58, 60 or the female connections 26, 27, 28 of the extension device 10 to check the integrity of the electrical connections between the ESP motor and the wires of the power cable.

Figure 4:
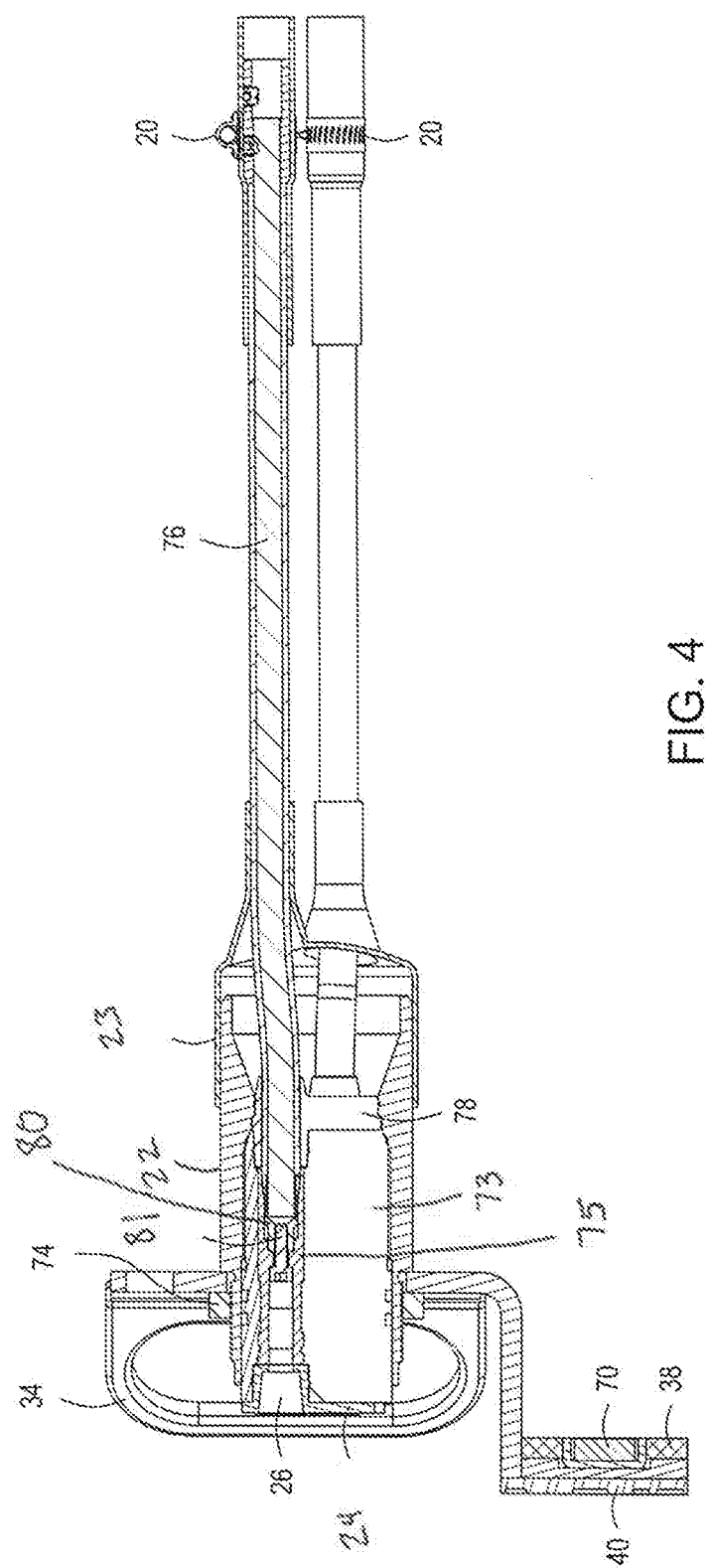
FIG. 4 is a side cutaway view of an embodiment of an extension device.

Referring to FIG. 4, a cutaway view of an extension device 10 is shown, which has features any one of which may be found in various specific embodiments, including both those that are shown in this specification and those that are not shown. Three conductive extension cables pass through the housing 22 and create electrical contacts with the female connections 26, 27, 28 on the front side of the extension device 10. The inside of the housing 22 of the extension device 10 may include a polymer block 73, e.g., polyether ether ketone (PEEK), or any other insulating material. The housing 22 may have three copper pipe channels 75 positioned within the polymer block 73 through which electrical connections can be made with each of the extension wires 76. The extension wires 76 may be secured to the housing 22 within the copper pipe channels 75 using a coupling. The coupling may include a Gator Gripp® coupling, information on which may be found in U.S. Pat. No. 7,473,129 which is hereby incorporated by reference as though set forth in its entirety, specifically FIGS. 1-3, 4B, 5, 7, 8A and the drawing descriptions corresponding to these figures. For example, the coupling may include a conductive cylinder 80 having a number of sealing lips on a sealing opening and threading on the screw opening of the conductive cylinder 80. An extension wire 76 may be positioned in the sealing opening, then a set screw 81 may be screwed into the threading of the screw opening; screwing the set screw 81 into the conductive cylinder 80 may cause the sealing opening of the conductive cylinder 80 to compress axially inward and secure the extension wire 76 within the conductive cylinder 80. This may permanently deform the conductive cylinder 80.

The housing 22 and a portion of the extension cables may be enclosed in a sealing structure 23 including an insulating material, e.g., ethylene propylene diene monomer, capable of forming a water-tight seal protecting the electrical connection of the extension cables to the conductive cylinder 80. The sealing structure 23 may have a larger opening on one end corresponding to the housing 22 and three smaller openings on the other end corresponding to the extension cables and may be molded to tightly fit around the housing 22 and extension cables. One or more additional seals 78 may be included to further protect the integrity of the electrical contacts within the extension device 10.

The mount 40 of the extension device 10 may include a magnetic portion. The mount 40 inner surface 38 adjacent to the magnet 70 may include Teflon®, such that the extension device 10 may be more easily moved (e.g., slid while the magnet 70 is still in contact with the cross arm) along a cross arm that the magnet 70 is coupled to (see FIG. 3). The extension device 10 may be capable of being disassembled to remove the handle body, including the mount 40 and handles 34, from the housing 22 and extension cables of the extension device. The handle body may include an opening through which the housing 22 is positioned. The end of the housing 22 furthest from the extension cables may include outer threading, and the housing 22 may be secured to the handle body using a retaining ring 74 including an inner threaded surface. The retaining ring 74 may be textured to provide a better grip with which it may be removed by hand. The retaining ring 74 may include flattened sections on the outer surface that may be used with a tool to remove the retaining ring 74 from the housing 22.

Figure 5A:
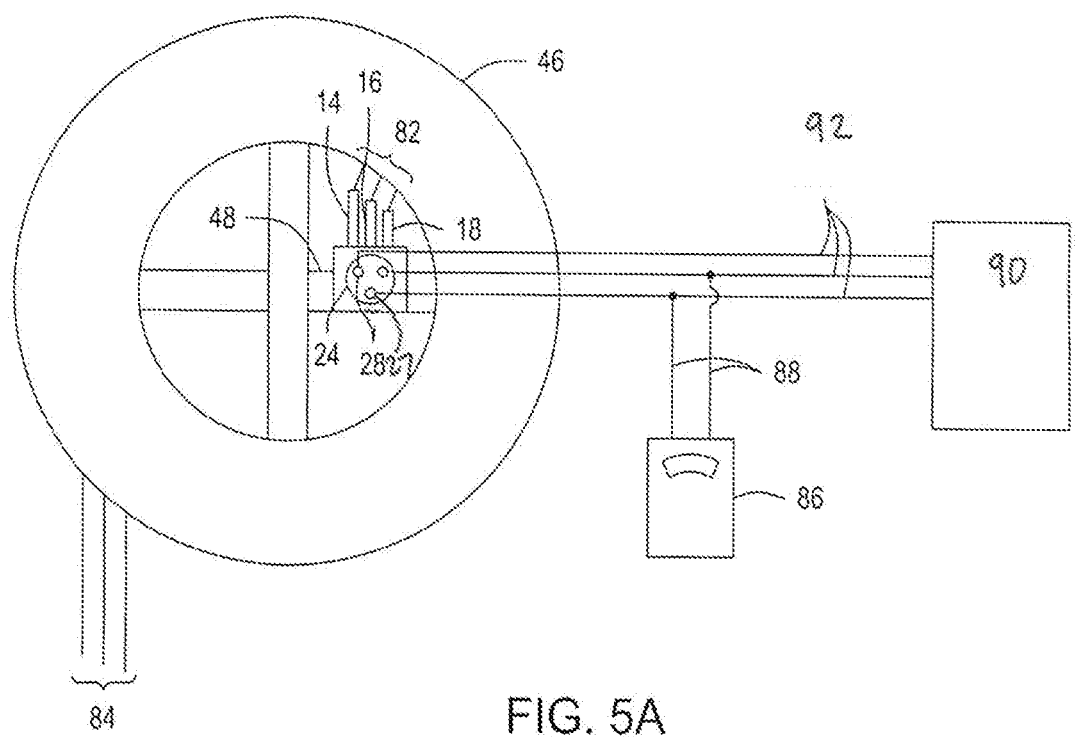
FIGS. 5A and 5B are simplified wiring diagrams depicting connections in an embodiment of an extension device.
Figure 5B:
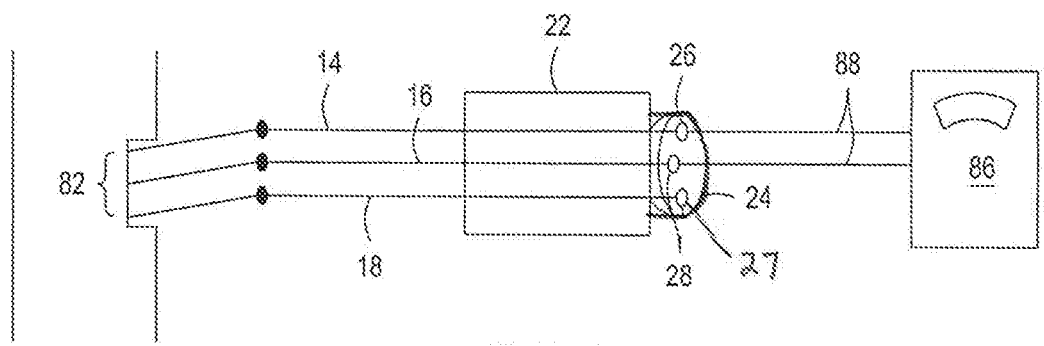

Referring to FIGS. 5A and 5B, simplified wiring diagrams are shown, which have features any one of which may be found in various specific embodiments, including both those that are shown in the specification and those that are not shown. In FIG. 5A, electrical connections between the power cable on the cable reel 46, the extension device, a testing device 86, and a control panel 90 are shown. The well side end 82 of the power cable protrudes from the inner surface of the drum of the cable reel 46. The three extension cables 14, 16, 18 of the extension device couple to the well side end 82 of the power cable. As discussed, the power cable preferably includes three separate wires separated by insulating material, and the three wires can be oriented to be flat (all three wires in a row) or rounded (three wires bundled together). Each of the three wires is coupled to the extension cables 14, 16, 18 using the metal contacts and set screws (see FIG. 1 description). The extension cables 14, 16, 18 provide an electrical connection through the extension device from one end of the extension cables to the female connections 26, 27, 28 on front connection plate 24. Control panel cables 92 may be coupled to the female connections 26, 27, 28 to provide an electrical connection between control panel 90 and the extension device, effectively connecting the three wires of the power cable to the control panel 90. Testing of the integrity of the electrical circuit downhole may be performed using the control panel 90. Alternatively, testing contacts 88 of a testing device 86 (e.g., multimeter) may positioned at a point along the control panel cables 92 to test the integrity of the electrical circuit downhole. Testing may also be performed when the power cable is not coupled to the control panel 90. In FIG. 5B, electrical connections between the well side end 82 of the power cable on the cable reel 46, the extension device, and a testing device 86 are shown. In this depiction, the testing contacts 88 of the testing device 86 may be positioned to contact the female connections 26, 27, 28 of the extension device itself.

What is claimed as the invention is:

1. A method comprising:
    coupling a first flexible cable to a first end of a first wire of an electronic submersible pump (ESP) power cable,
    coupling a second flexible cable to a first end of a second wire of said ESP power cable;
    coupling a second end of the first wire of the electronic submersible pump power cable to an ESP;
    coupling a second end of the second wire of said ESP power cable to said ESP, wherein said power cable is positioned on a cable reel;
    coupling a cable testing unit having a housing element, to said cable reel, by:
        connecting a first female contact of the housing element to said first flexible cable forming an electrical connection to said first wire;
        connecting a second female contact of the housing element to said second flexible cable forming an electrical connection to said second wire;
        securely engaging said cable reel to a mounting plate of the cable testing unit; and
    testing for the presence of an electrical connection between said first wire and said second wire using said first female contact and said second female contact.

2. The method of claim 1 wherein coupling said cable testing unit with said cable reel comprises securing said cable testing unit to said cable reel using magnetic forces.

3. The method of claim 1 wherein said cable testing unit further comprises a third flexible cable capable of being coupled to a first end of a third wire of said ESP power cable.

4. The method of claim 1 wherein said first and second flexible cables are coupled to said first and second female connections using an axial crimping coupling.

5. The method of claim 1 wherein testing for the presence of an electrical connection between said first wire and said second wire comprises measuring the resistance across said first wire and said second wire of said power cable.

6. A method for facilitating cable testing using a cable testing unit comprising a housing element configured with at least one female connector, wherein said at least one female connector is configured to receive at least one corresponding flexible conductive cable, said at least one corresponding flexible conductive cable being configured to couple to a power cable; a mounding plate configured to securely engage said cable testing unit to a cable reel, said method comprising:
    coupling said cable testing unit to said power cable positioned on said cable reel, through said at least one corresponding, flexible conductive cable;

positioning said cable testing unit on said cable reel such that the at least one female connector is positioned outside an inner drum of said cable reel; and coupling said at least one female connector to a control panel such that an electrical connection is made between said control panel and said power cable.

7. The method of claim 6 wherein said power cable is connected to an electronic submersible pump (ESP) and further comprising testing an electrical connection between said ESP and said at least one female connector.

8. The method of claim 6 wherein said at least one female connector of said cable testing unit comprises: a first female connector configured to receive a first flexible conductive cable of said at least one corresponding, flexible conductive cable; and a second female connector configured to receive a second flexible conductive cable of said at least one corresponding, flexible conductive cable.

9. The method of claim 8 wherein said at least one female connector of said cable testing unit further comprises a third female connector configured to receive a third flexible conductive cable of said at least one corresponding, flexible conductive cable.

10. The method of claim 6 further comprising testing said electrical connection between said power cable and said control panel to ensure said electrical connection is sufficient.

11. An apparatus comprising:
a least one flexible conductive cable;
a cable reel;
a power cable; and
a cable testing unit comprising:
a housing element configured with at least one female connector, wherein said at least one female connector is coupled to said at least one corresponding, flexible conductive cable, said at least one corresponding, flexible conductive cable is coupled to said power cable of an electronic submersible pump, wherein said power cable is positioned on said cable reel; and
a mounting plate configured to securely engage said cable testing unit to said cable reel.

12. The apparatus of claim 11 wherein said mounting plate further comprises a magnet that is capable of securely coupling said cable testing unit to said cable reel.

13. The apparatus of claim 11 further comprising an opening capable of being gripped with human hands that is not electronically connected to said at least one corresponding, flexible conductive cable, said power cable, or said at least one female connector.

14. The apparatus of claim 11 further comprising a polymer coating that forms a water-tight seal where the electrical connection is made between said at least one female connector and said at least one corresponding, flexible conductive cable.

15. The apparatus of claim 11 wherein said at least one corresponding, flexible conductive cable comprise copper.

* * * * *